(12) United States Patent
Lee et al.

(10) Patent No.: US 8,263,480 B2
(45) Date of Patent: Sep. 11, 2012

(54) METHODS FOR SITE-SELECTIVE GROWTH OF HORIZONTAL NANOWIRES, NANOWIRES GROWN BY THE METHODS AND NANODEVICES COMPRISING THE NANOWIRES

(75) Inventors: Eun Kyung Lee, Suwon-si (KR); Byoung Lyong Choi, Seoul (KR); Young Kuk, Seoul (KR); Je Hyuk Choi, Seoul (KR); Hun Huy Jung, Seoul (KR)

(73) Assignees: Samsung Electronics Co., Ltd. (KR); Seoul National University Industry Foundation (KR)

( * ) Notice: Subject to any disclaimer, the term of this patent is extended or adjusted under 35 U.S.C. 154(b) by 0 days.

(21) Appl. No.: 12/708,007

(22) Filed: Feb. 18, 2010

(65) Prior Publication Data

US 2010/0144126 A1    Jun. 10, 2010

Related U.S. Application Data

(62) Division of application No. 12/051,513, filed on Mar. 19, 2008, now Pat. No. 7,696,097.

(30) Foreign Application Priority Data

Aug. 29, 2007    (KR) .................. 10-2007-0087146

(51) Int. Cl.
*H01L 21/203*    (2006.01)

(52) U.S. Cl. .............. 438/478; 438/22; 438/48; 438/99; 438/700; 438/962; 257/37; 257/E21.091; 257/E21.507; 977/762; 977/742; 977/840

(58) Field of Classification Search ........... 257/E21.091, 257/E39, E51.038–E51.04, E23.074, E23.165, 257/37, E21.507; 438/22, 48, 99, 478, 775–777, 438/962, 700; 977/762, 785, 936, 953, 957, 977/958, 700, 742, 840, 842; 427/249.1, 427/307, 309, 577; 423/447.3; 205/188

See application file for complete search history.

(56) References Cited

U.S. PATENT DOCUMENTS

| | | | |
|---|---|---|---|
| 6,628,053 B1 * | 9/2003 | Den et al. ............... | 313/310 |
| 7,332,736 B2 | 2/2008 | Jin | |
| 2002/0014667 A1 | 2/2002 | Shin et al. | |
| 2005/0121068 A1 * | 6/2005 | Sager et al. ........... | 136/252 |
| 2007/0026645 A1 | 2/2007 | Lieber et al. | |
| 2007/0148949 A1 * | 6/2007 | Suh et al. ............... | 438/612 |
| 2008/0135826 A1 * | 6/2008 | Fonash et al. .......... | 257/9 |

* cited by examiner

*Primary Examiner* — Hsien Ming Lee
*Assistant Examiner* — Walter H Swanson
(74) *Attorney, Agent, or Firm* — Cantor Colburn LLP

(57) ABSTRACT

Methods for the site-selective growth of horizontal nanowires are provided. According to the methods, horizontal nanowires having a predetermined length and diameter can be grown site-selectively at desired sites in a direction parallel to a substrate to fabricate a device with high degree of integration. Further provided are nanowires grown by the methods and nanodevices comprising the nanowires.

7 Claims, 15 Drawing Sheets

METHODS FOR SITE-SELECTIVE GROWTH OF HORIZONTAL NANOWIRES, NANOWIRES GROWN BY THE METHODS AND NANODEVICES COMPRISING THE NANOWIRES

CROSS-REFERENCE TO RELATED APPLICATION

This application is a divisional application of U.S. application Ser. No. 12/051,513, filed on Mar. 19, 2008, which claims priority under 35 U.S.C. §119(a) to Korean Patent Application No. 10-2007-0087146, filed on Aug. 29, 2007, the entire contents of which are hereby incorporated by reference.

BACKGROUND OF THE INVENTION

1. Field of the Invention

The present invention relates to methods for the site-selective growth of horizontal nanowires, nanowires grown by the methods, and nanodevices comprising the nanowires. More particularly, the present invention relates to methods for the site-selective growth of horizontal nanowires having a predetermined length and diameter at desired sites in a direction parallel to a substrate to fabricate a device with high degree of integration, nanowires grown by the methods, and nanodevices comprising the nanowires.

2. Description of the Related Art

Nanowires are linear materials whose diameter is in the nanometer range (1 nm=$10^{-9}$ m) and whose length is several hundred nanometers or on the order of micrometers or millimeters. Nanowires exhibit various physical properties depending on their diameter and length. Nanowires can find various applications in highly integrated devices due to their small size. Nanowires offer advantages in that electron mobility characteristics in particular directions and optical properties, such as polarization, inherent to nanowires can be utilized.

Chemical vapor deposition (CVD), laser ablation, methods using templates and other methods have been employed to prepare nanowires. Such conventional methods have a problem in that nanowires are randomly grown, resulting in non-uniform diameter and length distributions.

Extensive research on nanowires has been made in nanotechnology fields, including photonic devices, transistors and memory devices. Devices using semiconductor nanowires have hitherto been fabricated by bottom-up approaches.

According to the bottom-up approaches, nanowires are arranged on substrates by a suitable technique, such as nanomanipulation, hydrodynamic alignment, alignment by imprinting, or alignment using hydrophilicity and/or hydrophobicity of liquid, followed by planar lithography to form connection points. However, the integration technologies are not suitable for the fabrication of large-scale integrated devices for industrial application. Current research on the integration technology of nanowires is unsatisfactory and more research is still needed.

Although small-size devices can be fabricated using nanowires, technology to selectively arrange nanowires at desired sites on substrates to fabricate devices has not yet been put to practical use.

SUMMARY OF THE INVENTION

In one embodiment, the present invention provides methods for the site-selective growth of horizontal nanowires having a predetermined length and diameter at desired sites in a direction parallel to a substrate to fabricate a device with high degree of integration In another embodiment, the present invention provides site-selectively grown horizontal nanowires prepared by the growth method.

In yet another embodiment, the present invention provides nanodevices comprising the site-selectively grown horizontal nanowires.

In yet another embodiment, the present invention provides a method for fabricating a transistor using a channel layer formed of the site-selectively grown horizontal nanowires.

In accordance with one aspect of the present invention, there is provided a method for the site-selective growth of horizontal nanowires, comprising:

forming a first silicon oxide thin film on a silicon substrate (first step); sequentially removing portions of the first silicon oxide thin film and portions of the silicon substrate by etching to form two or more elongated grooves having a predetermined width and length (second step);

removing the unetched portion of the first silicon oxide thin film remaining on the silicon substrate (third step);

oxidizing the surface of the silicon substrate having the elongated grooves to form a second silicon oxide thin film, the three wall surfaces between the respective grooves being oxidized to leave silicon cores surrounded by the second silicon oxide thin film (fourth step);

vertically etching and removing portions of both ends of the silicon cores surrounded by the second silicon oxide thin film by patterning (fifth step);

dissolving the silicon cores within the second silicon oxide thin film to form hollow channels whose both ends are opened (sixth step);

depositing catalytic metal layers to cover the open ends positioned at one side of the hollow channels (seventh step);

forming a protective film on the upper surfaces of the catalytic metal layers to inhibit vertical growth of nanowires from the catalytic metal layers (eighth step); and growing nanowires from the catalytic metal layers within the hollow channels in a direction parallel to the silicon substrate (ninth step).

In accordance with another aspect of the present invention, there is provided a method for the site-selective growth of horizontal nanowires, comprising:

forming a first silicon oxide thin film on a silicon substrate (first step);

forming at least long aluminum layer having a predetermined thickness, length and width at sites where it is desired to grow nanowires on the first silicon oxide thin film by patterning (second step);

forming a second silicon oxide thin film to cover all surfaces except surfaces of one side of the aluminum layer (third step);

anodizing the uncovered surfaces of the aluminum layer to a predetermined depth to form hollow channels, each of which is surrounded by an aluminum oxide film, in a direction parallel to the silicon substrate (fourth step);

depositing catalytic metal layers on the bottom surfaces of the hollow channels opposed to the openings of the hollow channels (fifth step); and growing nanowires from the catalytic metal layers within the hollow channels in a direction parallel to the silicon substrate (sixth step).

In accordance with another aspect of the present invention, there are provided site-selectively grown horizontal nanowires prepared by the growth methods.

In accordance with another aspect of the present invention, there are provided nanodevices comprising the site-selectively grown horizontal nanowires.

In accordance with yet another aspect of the present invention, there is provided a method for fabricating a transistor using a channel layer formed of the site-selectively grown horizontal nanowires.

BRIEF DESCRIPTION OF THE DRAWINGS

The aforementioned features and other advantages of the present invention will be more clearly understood from the following detailed description taken in conjunction with the accompanying drawings, in which.

DESCRIPTION OF THE PREFERRED EMBODIMENTS

Preferred embodiments of the present invention will now be described in greater detail with reference to the accompanying drawings.

Figure 1A:
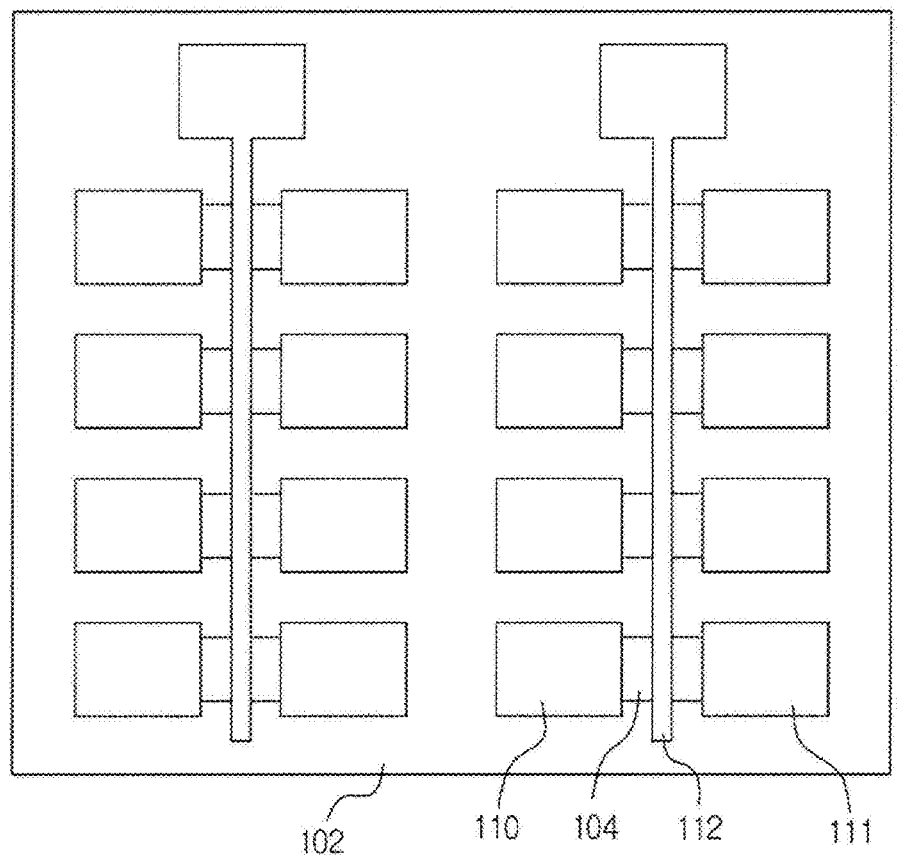
FIGS. 1a and 1b are a plan view and a front cross-sectional view of a device in which a plurality of transistors comprising site-selectively grown horizontal nanowires according to an embodiment of the present invention are integrated, respectively.
Figure 1B:
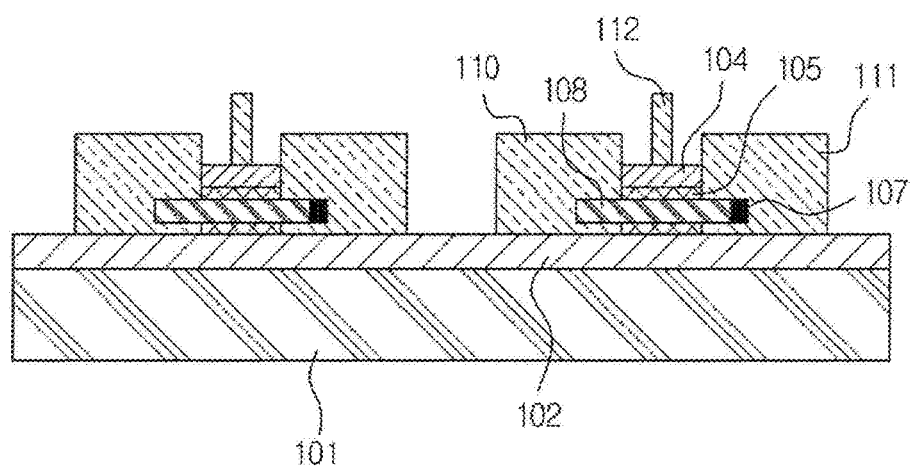
Figure 2:
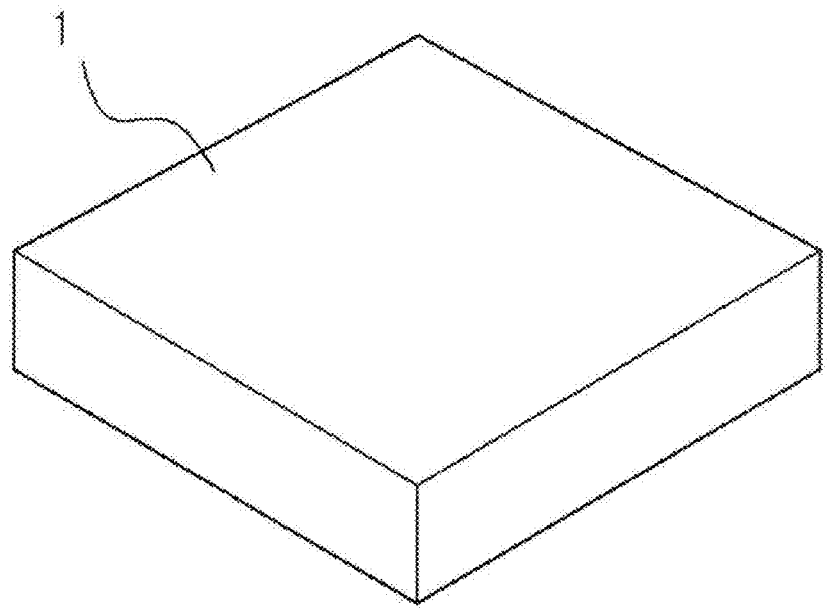
FIGS. 2 to 12 are perspective views and cross-sectional perspective views that illustrate the respective steps of a method for the site-selective growth of horizontal nanowires according to one embodiment of the present invention.

FIGS. 1a and 1b illustrate a device in which a plurality of transistors comprising site-selectively grown horizontal nanowires according to an embodiment of the present invention are integrated. Referring to FIGS. 1a and 1b, nanowires 108 are grown at selected sites in a direction parallel to a silicon substrate 101. The grown nanowires are used to form channel layers of the transistors. As a result, a high degree of integration of the device can be achieved.

In one aspect, the present invention provides a method for the site-selective growth of horizontal nanowires, comprising:

forming a first silicon oxide thin film on a silicon substrate (first step);

sequentially removing portions of the first silicon oxide thin film and portions of the silicon substrate by etching to form two or more elongated grooves having a predetermined width and length (second step);

removing the unetched portion of the first silicon oxide thin film remaining on the silicon substrate (third step);

oxidizing the surface of the silicon substrate having the elongated grooves to form a second silicon oxide thin film, the three wall surfaces between the respective grooves being oxidized to leave silicon cores surrounded by the second silicon oxide thin film (fourth step);

vertically etching and removing portions of both ends of the silicon cores surrounded by the second silicon oxide thin film by patterning (fifth step);

dissolving the silicon cores within the second silicon oxide thin film to form hollow channels whose both ends are opened (sixth step);

depositing catalytic metal layers to cover the open ends positioned at one side of the hollow channels (seventh step);

forming a protective film on the upper surfaces of the catalytic metal layers to inhibit vertical growth of nanowires from the catalytic metal layers (eighth step); and growing nanowires from the catalytic metal layers within the hollow channels in a direction parallel to the silicon substrate (ninth step).

Figure 3:
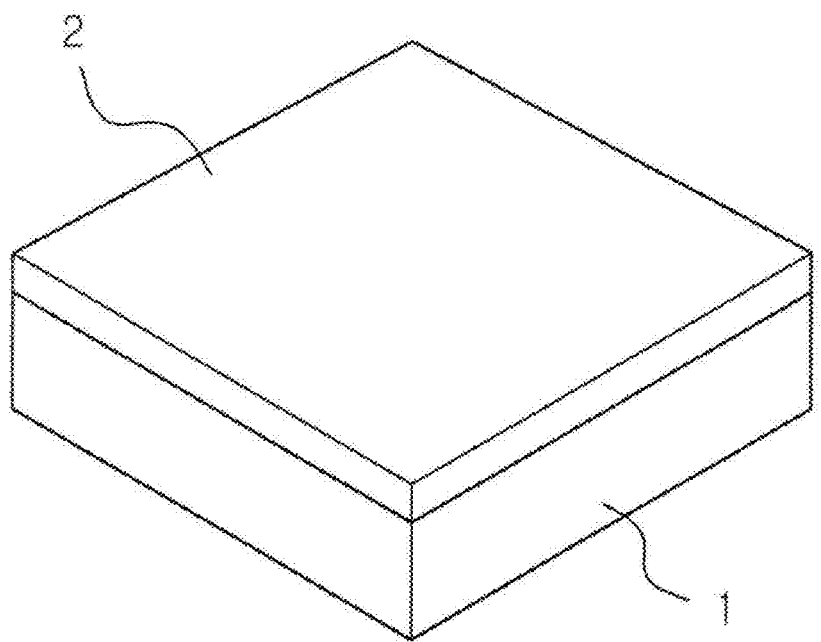

An explanation of the method according to the present invention will be given below with reference to FIGS. 2 to 12. In the first step, a silicon substrate 1 is prepared (FIG. 2) and a first silicon thin film 2 is formed thereon (FIG. 3). The first silicon oxide thin film 2 may be formed by oxidizing the surface of the silicon substrate 1. Deposition may be performed to form the first silicon oxide thin film 2 on the silicon substrate 1. Examples of suitable deposition techniques include, but are not necessarily limited to, sputtering and chemical vapor deposition.

Figure 4:
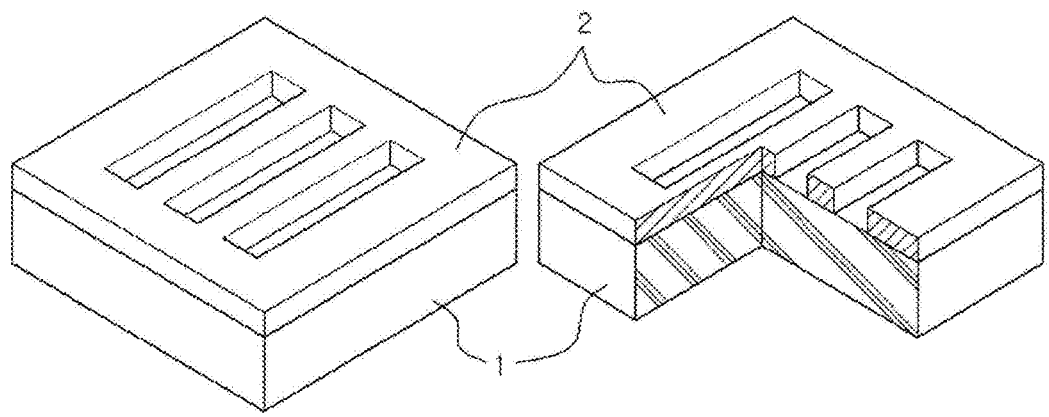
Figure 5:
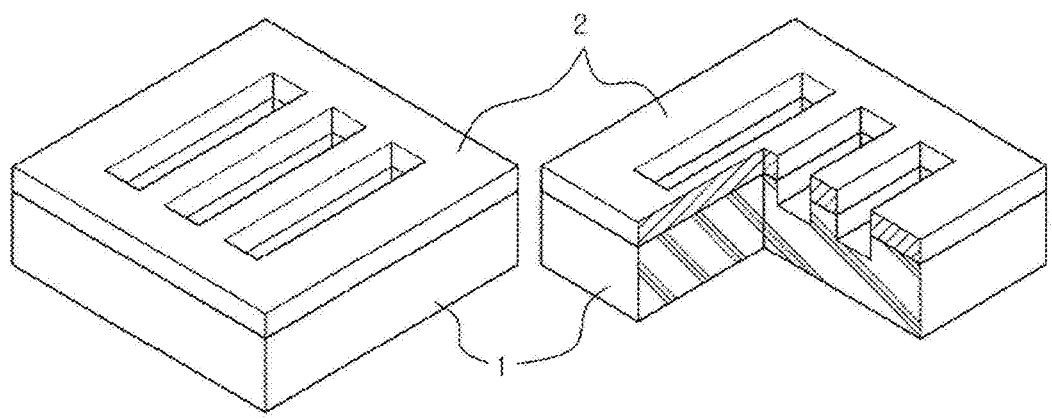

In the second step, after sites appropriate for the growth of nanowires are selected, portions of the first silicon oxide thin film 2 and portions of the silicon substrate 1 are sequentially removed by etching to form two or more elongated grooves within the first silicon oxide thin film 2 and the silicon substrate 1 (FIGS. 4 and 5). The sequential etching may be performed by patterning the first silicon oxide thin film 2 and the silicon substrate 1 through a mask (e.g., a photoresist) at desired intervals and etching by a conventional technique (e.g., chemical or dry etching). The length and diameter of nanowires to be grown in the subsequent step are determined by the patterning. The grooves formed after etching have a predetermined width and length (FIG. 5).

Figure 6:
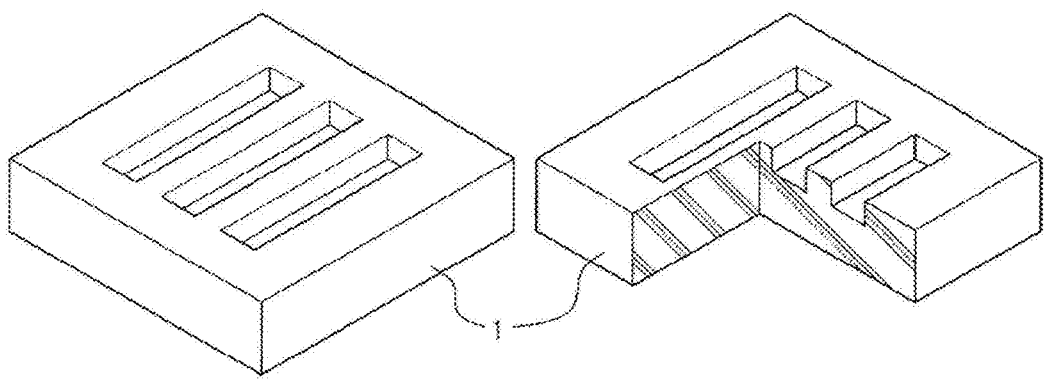

In the third step, the unetched portion of the first silicon oxide thin film 2 remaining on the silicon substrate 1 is removed (FIG. 6). Specifically, a hydrofluoric acid (HF) solution is used to dissolve the unetched portion of the first silicon oxide thin film 2 (wet etching). The unetched portion of the first silicon oxide thin film 2 may be removed by dry etching.

Figure 7:
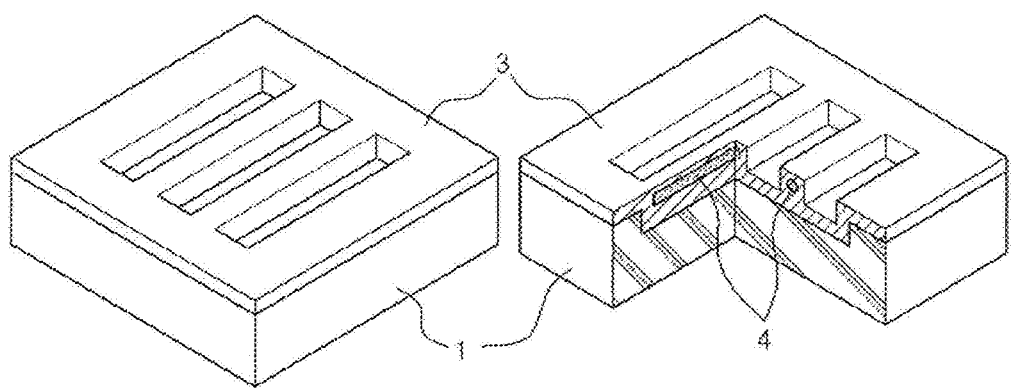

In the fourth step, the surface of the silicon substrate 1, on which the two or more elongated grooves are formed, is oxidized to form a second silicon oxide thin film 3. At this time, the three wall surfaces between the respective grooves are oxidized to leave silicon cores 4 surrounded by the second silicon oxide thin film 3 (FIG. 7).

Figure 8:
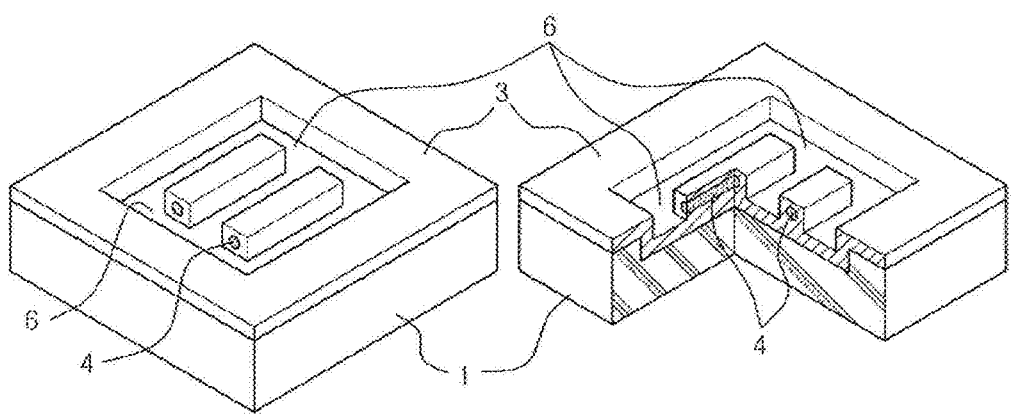

In the fifth step, portions 6 of both ends of the silicon cores 4 surrounded by the second silicon oxide thin film 3 are vertically etched and removed by patterning (FIG. 8). The etching is performed by a conventional technique (e.g., lithography). Taking into consideration the usefulness of the portions 6 for the fabrication of a nanodevice, it is preferred that the portions 6 be removed by etching in a vertical direction with respect to the second silicon oxide thin film 3.

Figure 9:
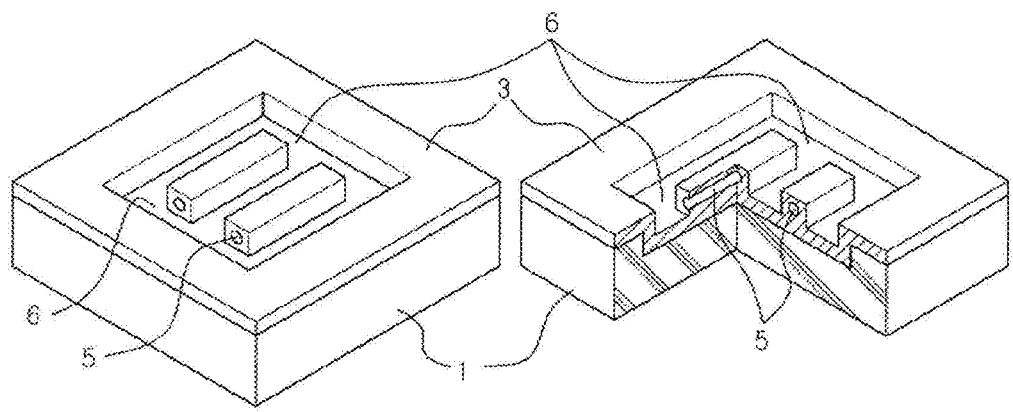

In the sixth step, the silicon cores 4 are dissolved with KOH to form hollow channels 5 whose both ends are opened (FIG. 9). Each of the hollow channels 5 may have a length of about 0.1 to about 10 μm and a diameter of about 100 nm or less. The length and diameter of the hollow channels 5 are factors determining those of nanowires to be grown within the hollow channels 5 in the subsequent step.

Figure 10:
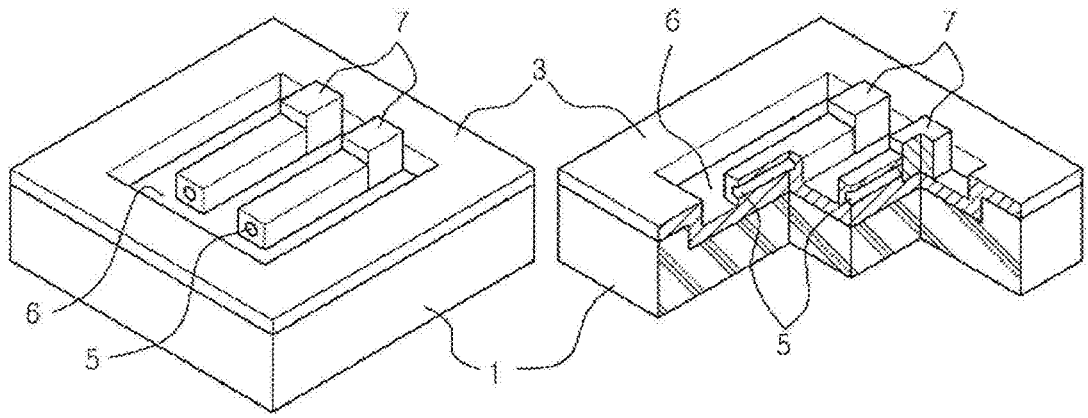

As shown in FIG. 10, catalytic metal layers 7 are deposited to cover the open ends positioned at one side of the hollow channels 5 (seventh step). Any technique may be employed to form the catalytic metal layers 7 so long as the objects of the present invention are not impaired. The catalytic metal layers 7 may be formed by techniques commonly employed in the art, such as sputtering, e-beam evaporation and chemical vapor deposition (CVD). Examples of suitable materials for the catalytic metal layers 7 include, but are not necessarily limited to, Au, Ni, Co, Ag, Pd, Ti, Cr, Fe and Al. The catalytic metal layers 7 may also be used as electrode layers of a device (e.g., a transistor), thus avoiding the need to remove the catalytic metal layers 7.

Figure 11:
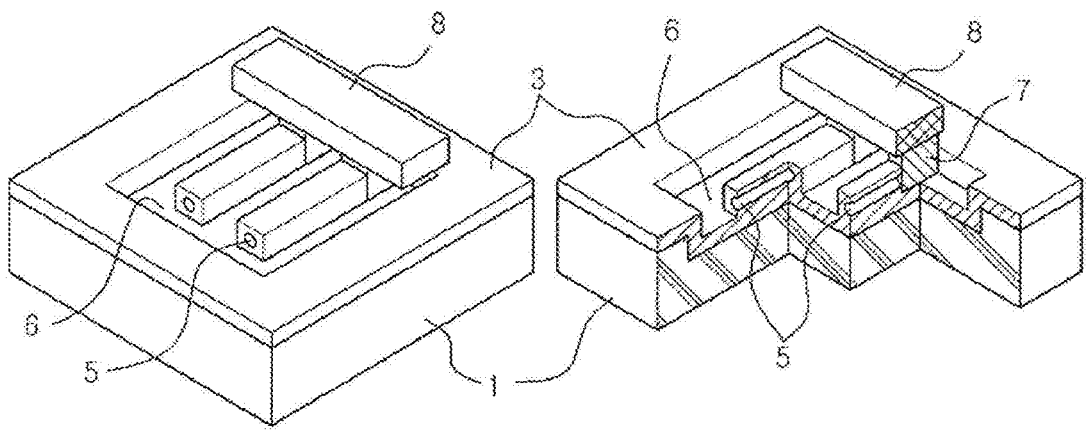

As shown in FIG. 11, a protective film 8 is formed on the upper surfaces of the catalytic metal layers 7 to inhibit vertical growth of nanowires from the catalytic metal layers 7 (eighth step). The protective film 8 may be formed of a material selected from the group consisting of, but not necessarily limited to, $SiO_2$ and $SiN_x$.

Figure 12:
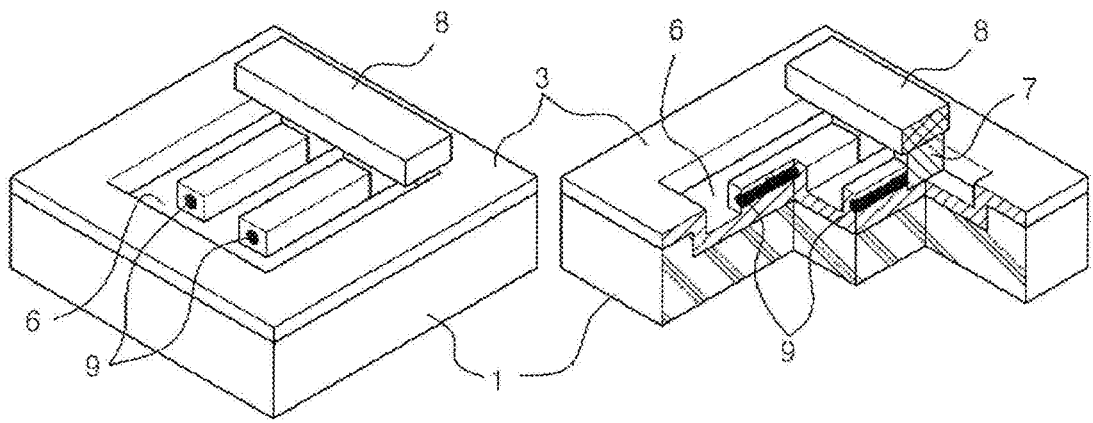
Figure 13:
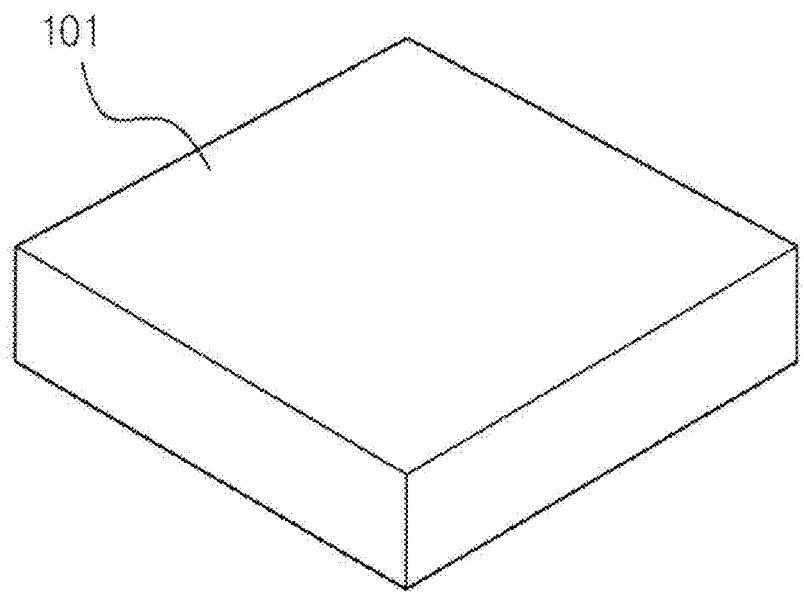
FIGS. 13 to 19 are perspective views and cross-sectional perspective views that illustrate the respective steps of a method for the site-selective growth of horizontal nanowires according to another embodiment of the present invention.

In the ninth step, nanowires 9 are allowed to grow from the catalytic metal layers 7 within the hollow channels 5 in a direction parallel to the silicon substrate 1 (FIG. 12). The method of the present invention is characterized in that the nanowires are grown by a vapor-liquid-solid (VLS) growth technique using the metal constituting the catalytic metal layers 7 as a catalyst. The vapor-liquid-solid (VLS) growth technique is one wherein nanowire precursors are put into a high-temperature furnace, condensed and crystallized on the surface of a molten catalyst (e.g., gold, cobalt or nickel) to be grown into nanowires.

According to the vapor-liquid-solid (VLS) growth technique, nanowires can be prepared by putting the silicon substrate 1, on which the catalytic metal layers 7 are formed, into a furnace and heating while feeding a carrier gas and nanowire precursors into the furnace.

The carrier gas used for the vapor-liquid-solid (VLS) growth technique may be selected from the group consisting of Ar, $N_2$, He and $H_2$, but is not limited thereto. The flow rate of the carrier gas is about 100 sccm and may be varied according to the type of processing.

The vapor-liquid-solid (VLS) growth technique may be carried out under a pressure of 760 torr or less and at a temperature between 370° C. and 800° C. The heating time may be varied depending on the desired length of nanowires to be prepared.

When it is intended to grow silicon nanowires by the vapor-liquid-solid (VLS) growth technique, precursors for the silicon nanowires may be $SiH_4$, $SiCl_4$, $SiH_2Cl_2$, etc., but are not particularly limited thereto.

As for nanowires composed of compound semiconductors, organometallic gases may be mainly used as nanowire precursors. Examples of suitable organometallic materials include, but are not necessarily limited to, trimethylgallium (TMG), arsine gas ($AsH_3$), trimethylindium (TMI), $PH_3$ and trimethylaluminum. Particularly, GaAs, a Group III-V compound semiconductor, is grown into nanowires by using trimethylgallium (TMG), arsenic gas ($AsH_3$), etc. as precursors. Trimethylgallium (TMG), trimethylindium (TMI), $PH_3$, etc. may be used as precursors for GaInP nanowires.

The site-selectively grown horizontal nanowires 9 prepared by the growth method may have a diameter of about 100 nm or less and a length of about 0.1 to about 10 μm. The size of the nanowires 9 is determined taking into consideration the operation and the degree of the integration of a nanodevice using the nanowires, but is not particularly limited to the diameter and length defined above.

The site-selectively grown horizontal nanowires 9 may be composed of a material selected from the group consisting of, but not necessarily limited to, silicon, compound semiconductors and metal oxides.

The site-selectively grown horizontal nanowires 9 may be doped with an n-dopant or p-dopant during the formation of the nanowires. For example, p-doped nanowires can be grown by a VLS growth technique using $B_2H_6$ and $SiH_4$ as a precursor for silicon nanowires.

n- and p-type doping regions may be formed in the nanowires during growth of the nanowires to allow the nanowires to have a p-n junction structure. The nanowires having a p-n junction structure are suitable for use in the fabrication of a light-emitting device.

Examples of the compound semiconductors constituting the site-selectively grown horizontal nanowires 9 include, but are not necessarily limited to, Group II-VI, Group III-V and Group IV-VI compound semiconductors, and mixtures thereof.

The Group II-VI compound semiconductors are selected from the group consisting of, but not necessarily limited to: binary compounds, e.g., CdSe, CdTe, ZnS, ZnSe and ZnTe; ternary compounds, e.g., CdSeS, CdSeTe, CdSTe, ZnSeS, ZnSeTe, ZnSTe, CdZnS, CdZnSe and CdZnTe; and quaternary compounds, e.g., CdZnSeS, CdZnSeTe, CdZnSTe, CdHgSeS, CdHgSeTe, CdHgSTe, HgZnSeS, HgZnSeTe and HgZnSTe.

The Group III-V compound semiconductors are selected from the group consisting of, but not necessarily limited to: binary compounds, e.g., GaN, GaP, GaAs, GaSb, InP, InAs and InSb; ternary compounds, e.g., GaNP, GaNAs, GaNSb, GaPAs, GaPSb, InNP, InNAs, InNSb, InPAs, InPSb and GaAlNP; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb.

The Group IV-VI compound semiconductors are selected from the group consisting of, but not necessarily limited to: binary compounds, e.g., PbS, PbSe and PbTe; ternary compounds, e.g., PbSeS, PbSeTe, PbSTe, SnPbS, SnPbSe and SnPbTe; and quaternary compounds, e.g., SnPbSSe, SnPbSeTe and SnPbSTe.

Examples of the metal oxides constituting the site-selectively grown horizontal nanowires 9 include, but are not necessarily limited to, $TiO_2$, ZnO, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$.

In another aspect, the present invention provides a method for the site-selective growth of horizontal nanowires, the method comprising the steps of:

forming a first silicon oxide thin film on a silicon substrate (first step);

forming at least one long aluminum layer having a predetermined thickness, length and width at sites where it is desired to grow nanowires on the first silicon oxide thin film by patterning (second step);

forming a second silicon oxide thin film to cover all surfaces except surfaces of one side of the aluminum layer (third step);

anodizing the uncovered surfaces of the aluminum layer to a predetermined depth to form hollow channels, each of which is surrounded by an aluminum oxide film, in a direction parallel to the silicon substrate (fourth step);

depositing catalytic metal layers on the bottom surfaces of the hollow channels opposed to the openings of the hollow channels (fifth step); and growing nanowires from the catalytic metal layers within the hollow channels in a direction parallel to the silicon substrate (sixth step).

In the second step, a plurality of long aluminum layers may be formed by patterning.

Figure 14:
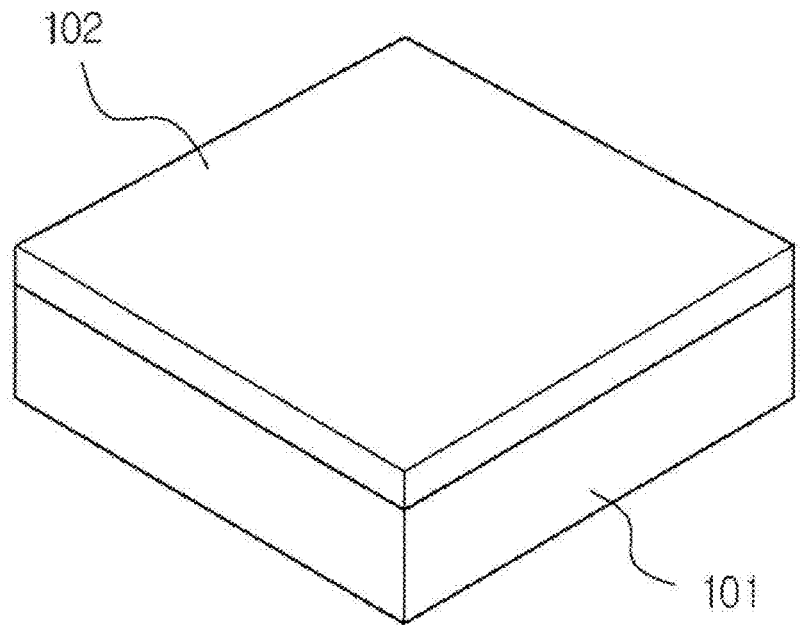

An explanation of the method according to the present invention will be given below with reference to FIGS. 13 to 19. In the first step, a silicon substrate 101 is prepared (FIG. 13) and a first silicon thin film 102 is formed thereon (FIG. 14). The first silicon oxide thin film 102 may be formed by oxidizing the surface of the silicon substrate 101. Deposition may be performed to form the first silicon oxide thin film 102 on the silicon substrate 101. Examples of suitable deposition techniques include, but are not necessarily limited to, sputtering, chemical vapor deposition and thermal evaporation.

Figure 15:
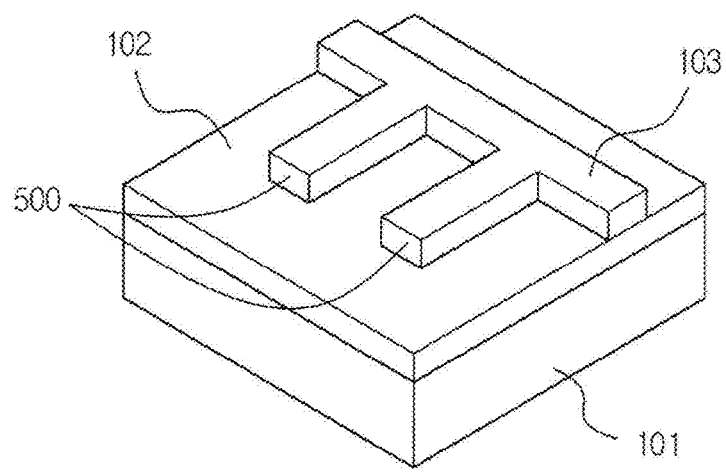

In the second step, patterning is performed to form a long branched aluminum layer 103 having a predetermined thickness, length and width at sites where it is desired to grow nanowires on the first silicon oxide thin film 102 (FIG. 15). The patterning is performed by a conventional technique (e.g., lithography). The aluminum layer 103 may be deposited by various techniques. Examples of such deposition techniques include, but are not necessarily limited to, evaporation deposition, sputtering, e-beam evaporation and chemical vapor deposition (CVD).

The aluminum layer 103 may have a thickness of 0.2 to 2 μm. The thickness of the aluminum layer serves to control the diameter of hollow channels to be formed in the subsequent step. That is, the diameter of nanowires to be grown within the hollow channels is determined by the thickness of the aluminum layer 103.

Figure 16:
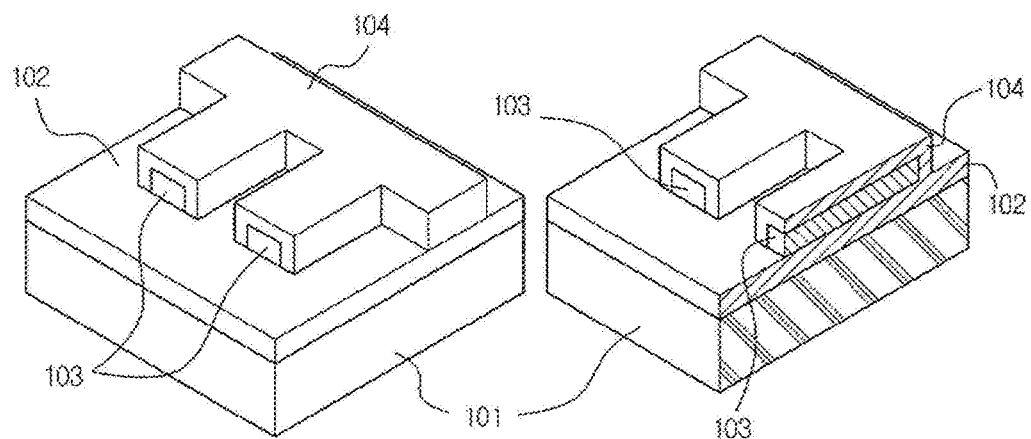

In the third step, a second silicon oxide thin film 104 is formed to cover all surfaces except surfaces 500 of one side of the aluminum layer 103 (FIG. 16). There is no particular limitation for the formation of the second silicon oxide thin film 104. The second silicon oxide thin film 104 is an insulating film that functions to allow nanowires to grow in one direction.

Figure 17:
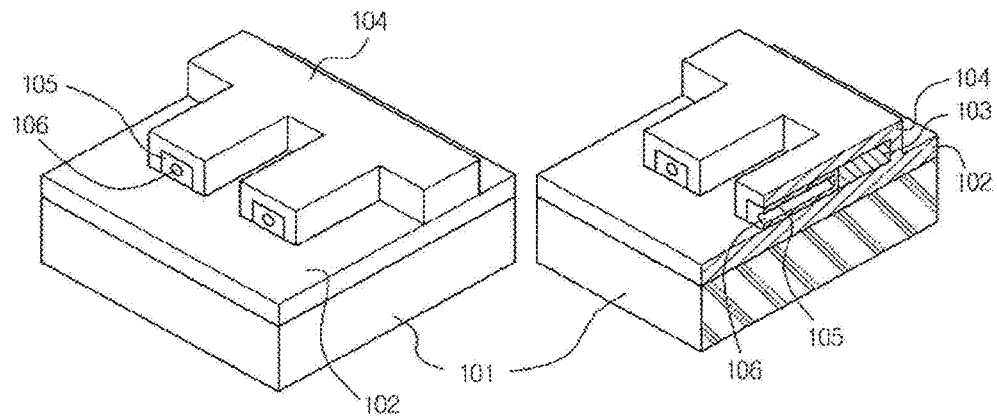

In the fourth step, the uncovered surfaces 500 of the aluminum layer 103 are anodized to a predetermined depth to form hollow channels 106, each of which is surrounded by an aluminum oxide film 105, in a direction parallel to the silicon substrate 101 (FIG. 17). Referring to FIG. 17, when the aluminum layer 103 is electrochemically oxidized using the silicon substrate 101 as an anode, portions of the aluminum layer 103 are converted to the aluminum oxide films 105. As the conversion proceeds, the hollow channels 106 are formed within the respective aluminum oxide films 105.

Each of the hollow channels 106 may have a length of 0.1-10 μm and a diameter of 100 nm or less. The length and diameter of the hollow channels 106 are factors determining those of nanowires to be grown within the hollow channels 106 in the subsequent step.

Figure 18:
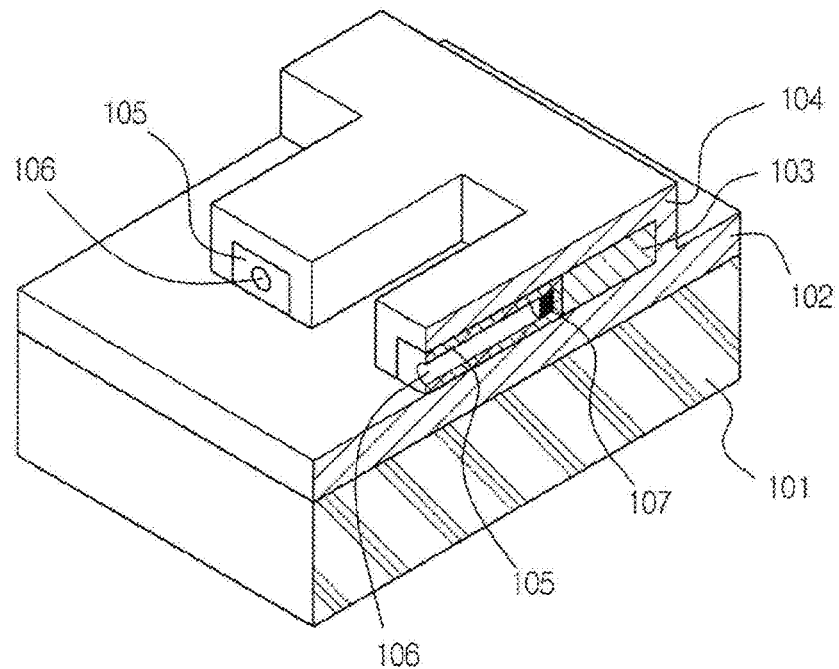

As shown in FIG. 18, catalytic metal layers 107 are deposited on the bottom surfaces of the hollow channels 106, which are opposed to the openings of the hollow channels 106 (fifth step). Any technique may be employed to form the catalytic metal layers 107 so long as the objects of the present invention are not impaired. The catalytic metal layers 107 may be formed by techniques commonly employed in the art, such as sputtering, e-beam evaporation and chemical vapor deposition (CVD). Examples of suitable materials for the catalytic metal layers 107 include, but are not necessarily limited to, Au, Ni, Co, Ag, Pd, Ti, Cr, Fe and Al. The catalytic metal layers 107 may also be used as electrode layers of a device (e.g., a transistor), thus avoiding the need to remove the catalytic metal layers 107.

Figure 19:
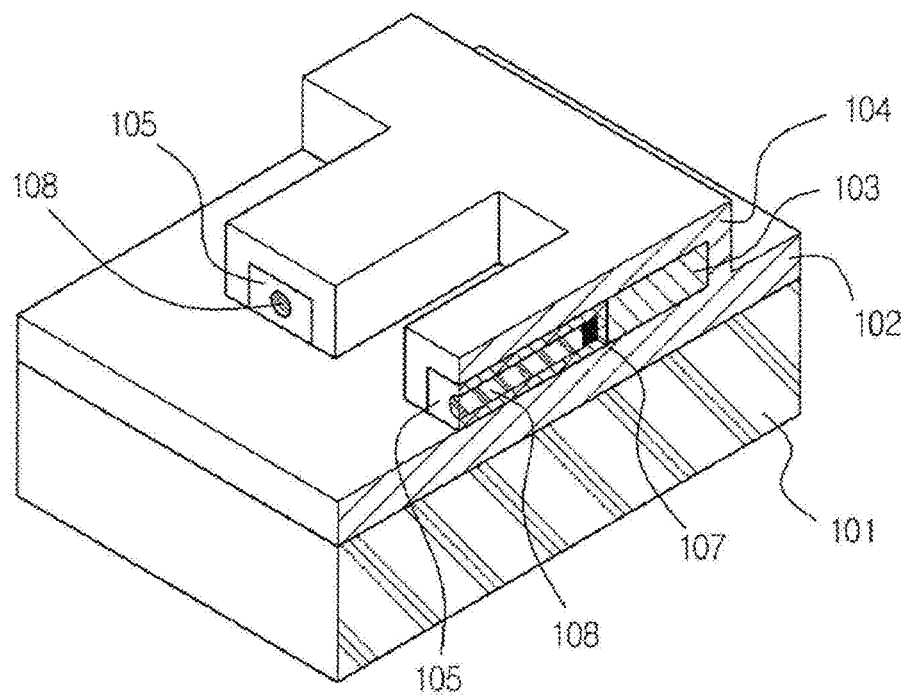

In the sixth step, nanowires 108 are allowed to grow from the catalytic metal layers 107 within the hollow channels 106 in a direction parallel to the silicon substrate 101 (FIG. 19). The method of the present invention is characterized in that the nanowires 108 are grown by a vapor-liquid-solid (VLS) growth technique using the metal constituting the catalytic metal layers 107 as a catalyst. The vapor-liquid-solid (VLS) growth technique is one wherein nanowire precursors are put into a high-temperature furnace, condensed and crystallized on the surface of a molten catalyst (e.g., gold, cobalt or nickel) to be grown into nanowires.

According to the vapor-liquid-solid (VLS) growth technique, nanowires can be prepared by putting the silicon substrate 101, on which the catalytic metal layers 107 are formed, into a furnace and heating while feeding a carrier gas and nanowire precursors into the furnace.

The carrier gas used for the vapor-liquid-solid (VLS) growth technique may be selected from the group consisting of Ar, $N_2$, He and $H_2$, but is not limited thereto. The flow rate of the carrier gas is about 100 sccm and may be varied according to the type of processing.

The vapor-liquid-solid (VLS) growth technique may be carried out under a pressure of 760 torr or less and at a temperature between 370° C. and 800° C. The heating time may be varied depending on the desired length of nanowires to be prepared.

When it is intended to grow silicon nanowires by the vapor-liquid-solid (VLS) growth technique, precursors for the silicon nanowires may be $SiH_4$, $SiCl_4$, $SiH_2Cl_2$, etc., but are not particularly limited thereto.

As for nanowires composed of compound semiconductors, organometallic gases may be mainly used as nanowire precursors. Examples of suitable organometallic materials include, but are not necessarily limited to, trimethylgallium (TMG), arsine gas ($AsH_3$), trimethylindium (TMI), $PH_3$ and trimethylaluminum. Particularly, GaAs, a Group III-V compound semiconductor, is grown into nanowires by using trimethylgallium (TMG), arsenic gas ($AsH_3$), etc. as precursors. Trimethylgallium (TMG), trimethylindium (TMI), $PH_3$, etc. may be used as precursors for GaInP nanowires.

The site-selectively grown horizontal nanowires 108 prepared by the growth method may have a diameter of 100 nm or less and a length of 0.1-10 μm. The size of the nanowires 108 is determined taking into consideration the operation and the degree of the integration of a nanodevice using the nanowires, but is not particularly limited to the diameter and length defined above.

The site-selectively grown horizontal nanowires 108 may be composed of a material selected from the group consisting of, but not necessarily limited to, silicon, compound semiconductors and metal oxides.

The site-selectively grown horizontal nanowires 108 may be doped with an n-dopant or p-dopant during the formation of the nanowires. For example, p-doped nanowires can be grown by a VLS growth technique using $B_2H_6$ and $SiH_4$ as a precursor for silicon nanowires.

n- and p-type doping regions may be formed in the nanowires during growth of the nanowires to allow the nanowires to have a p-n junction structure. The nanowires having a p-n junction structure are suitable for use in the fabrication of a light-emitting device.

Examples of the compound semiconductors constituting the site-selectively grown horizontal nanowires 108 include, but are not necessarily limited to, Group II-VI, Group III-V and Group IV-VI compound semiconductors, and mixtures thereof.

The Group II-VI compound semiconductors are selected from the group consisting of, but not necessarily limited to: binary compounds, e.g., CdSe, CdTe, ZnS, ZnSe and ZnTe; ternary compounds, e.g., CdSeS, CdSeTe, CdSTe, ZnSeS, ZnSeTe, ZnSTe, CdZnS, CdZnSe and CdZnTe; and quaternary compounds, e.g., CdZnSeS, CdZnSeTe, CdZnSTe, CdHgSeS, CdHgSeTe, CdHgSTe, HgZnSeS, HgZnSeTe and HgZnSTe.

The Group III-V compound semiconductors are selected from the group consisting of, but not necessarily limited to: binary compounds, e.g., GaN, GaP, GaAs, GaSb, InP, InAs and InSb; ternary compounds, e.g., GaNP, GaNAs, GaNSb, GaPAs, GaPSb, InNP, InNAs, InNSb, InPAs, InPSb and GaAlNP; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb.

The Group IV-VI compound semiconductors are selected from the group consisting of, but not necessarily limited to: binary compounds, e.g., PbS, PbSe and PbTe; ternary compounds, e.g., PbSeS, PbSeTe, PbSTe, SnPbS, SnPbSe and SnPbTe; and quaternary compounds, e.g., SnPbSSe, SnPbSeTe and SnPbSTe.

Examples of the metal oxides constituting the site-selectively grown horizontal nanowires 108 include, but are not necessarily limited to, $TiO_2$, ZnO, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$.

Figure 23:
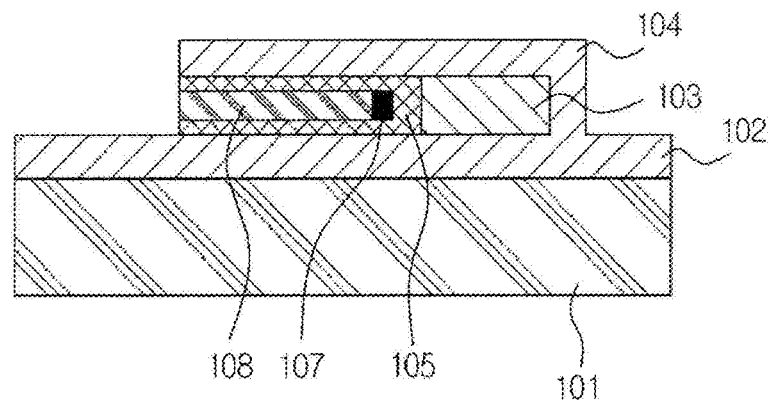
FIGS. 23 to 29 are schematic cross-sectional views that illustrate a method for the site-selective growth of horizontal nanowires in a multilayer structure according to an embodiment of the present invention.
Figure 24:
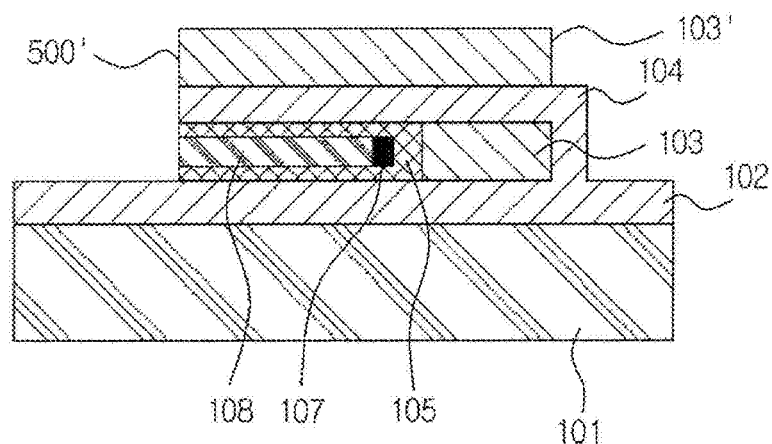
Figure 25:
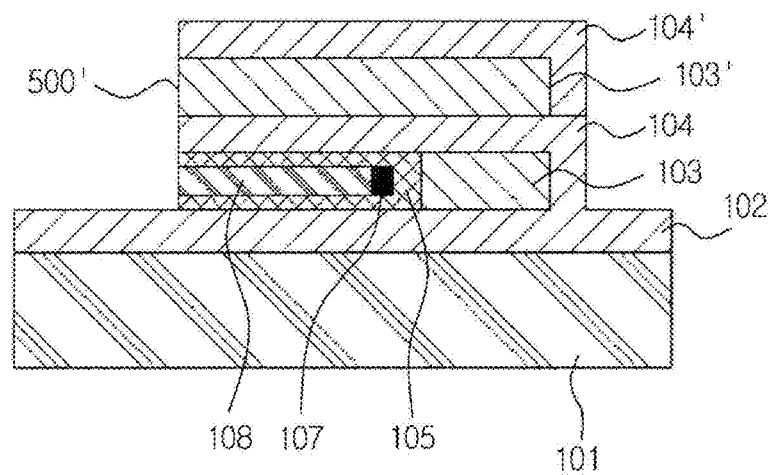
Figure 26:
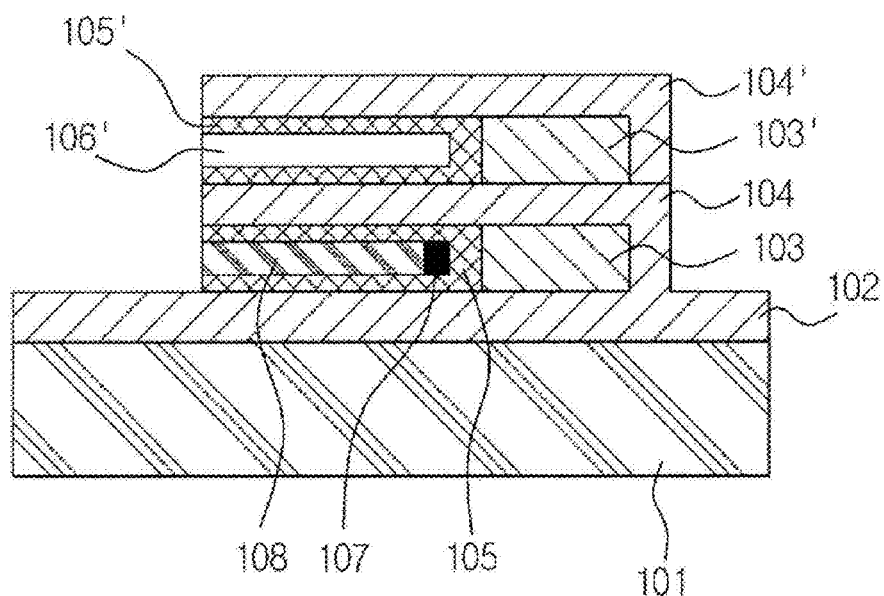
Figure 27:
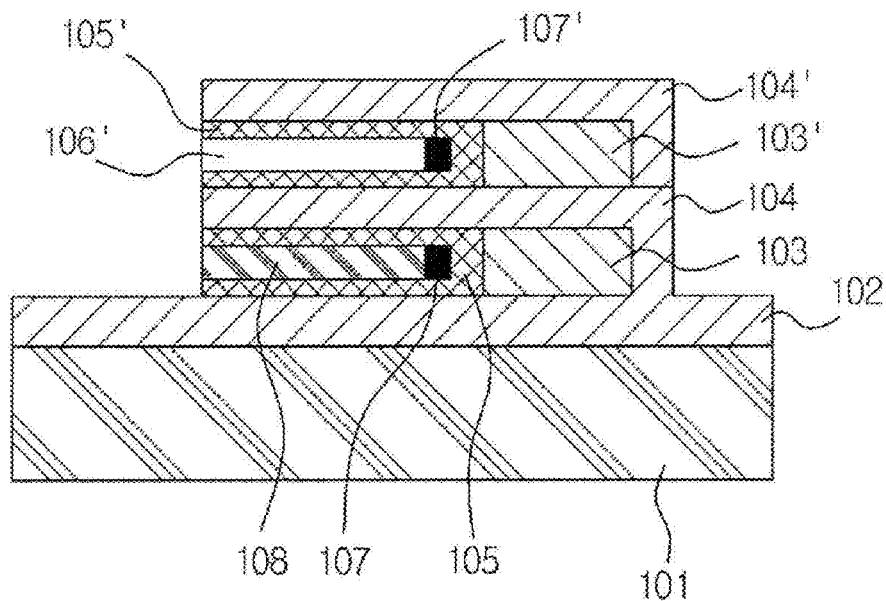
Figure 28:
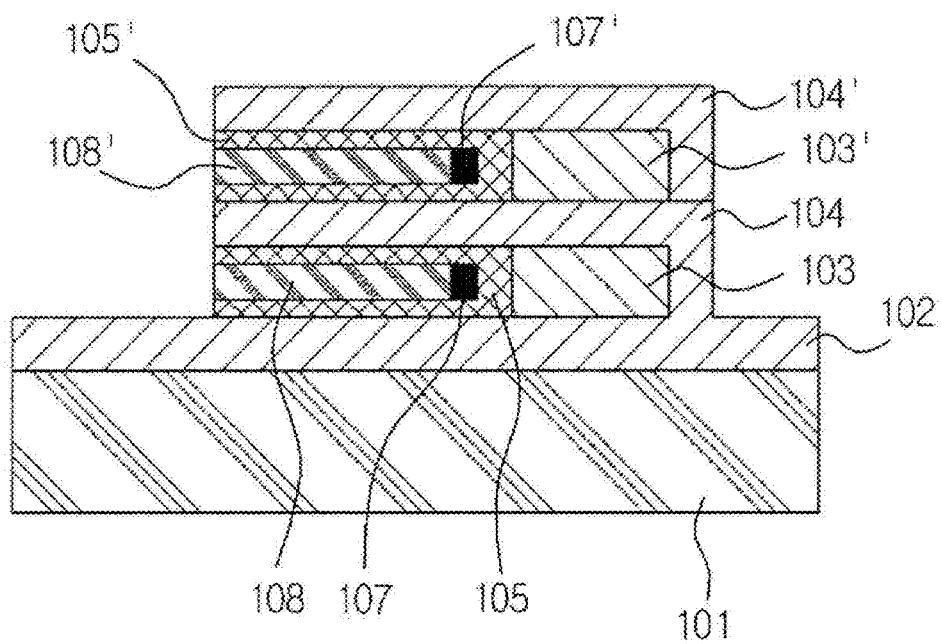

The second to sixth steps of the growth method according to the present invention are repeated at least twice to prepare nanowires in a multilayer structure. The preparation of the nanowires in a multilayer structure will now be explained with reference to FIGS. 23 to 29. First, an aluminum layer 103' having a predetermined thickness, length and width is deposited on the second silicon oxide thin film 104 of the monolayer structure comprising the site-selectively grown horizontal nanowires 108 (FIGS. 23 and 24). Then, a second silicon oxide thin film 104' is formed to cover all surfaces except surfaces 500' of one side of the aluminum layer 103' (FIG. 25). The uncovered surfaces 500' of the aluminum layer 103' are anodized to form hollow channels 106', each of which is surrounded by an aluminum oxide film 105', in a direction parallel to the silicon substrate 101 (FIG. 26). When the aluminum layer 103' is electrochemically oxidized using the silicon substrate 101 as an anode, portions of the aluminum layer 103' are converted to the aluminum oxide films 105'. As the conversion proceeds, the hollow channels 106' are formed within the respective aluminum oxide films 105'. Subsequently, catalytic metal layers 107' are deposited on the bottom surfaces of the hollow channels 106', which are opposed to the openings of the hollow channels 106' (FIG. 27). Then, nanowires 108' are allowed to grow from the catalytic metal layers 107' within the hollow channels 106' in a direction parallel to the silicon substrate 101 (FIG. 28). As a result, a bilayer structure of the site-selectively grown horizontal nanowires 108 and 108' are formed.

Figure 29:
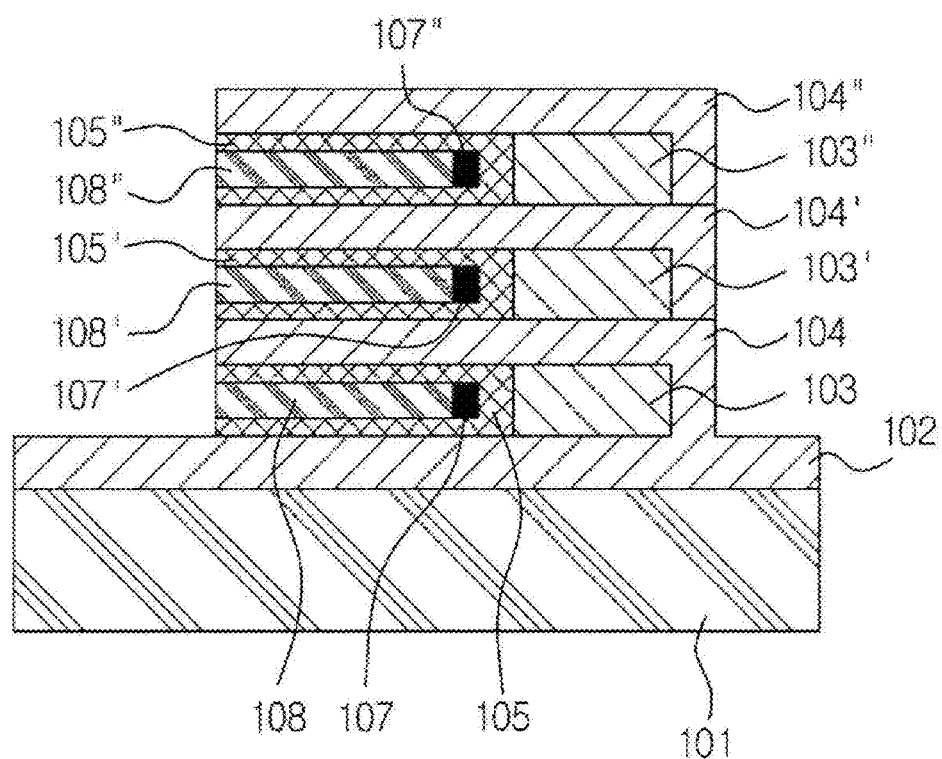

This procedure is repeated once more to form a trilayer structure of the site-selectively grown horizontal nanowires 108, 108' and 108" (FIG. 29).

The multilayer structure of the site-selectively grown horizontal nanowires is very useful for the fabrication of a nanodevice with high degree of integration.

Figure 30:
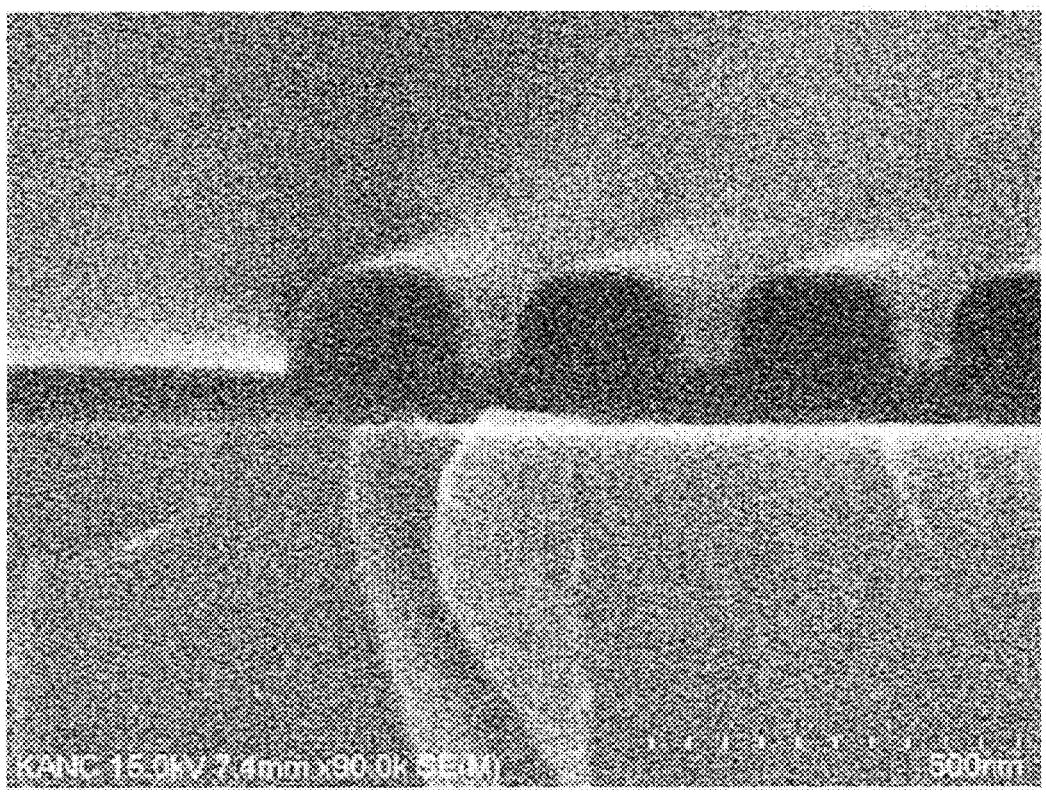
FIGS. 30 and 31 are scanning electron microscopy (SEM) images taken during site-selective growth of horizontal nanowires in accordance with an embodiment of the present invention.
Figure 31:
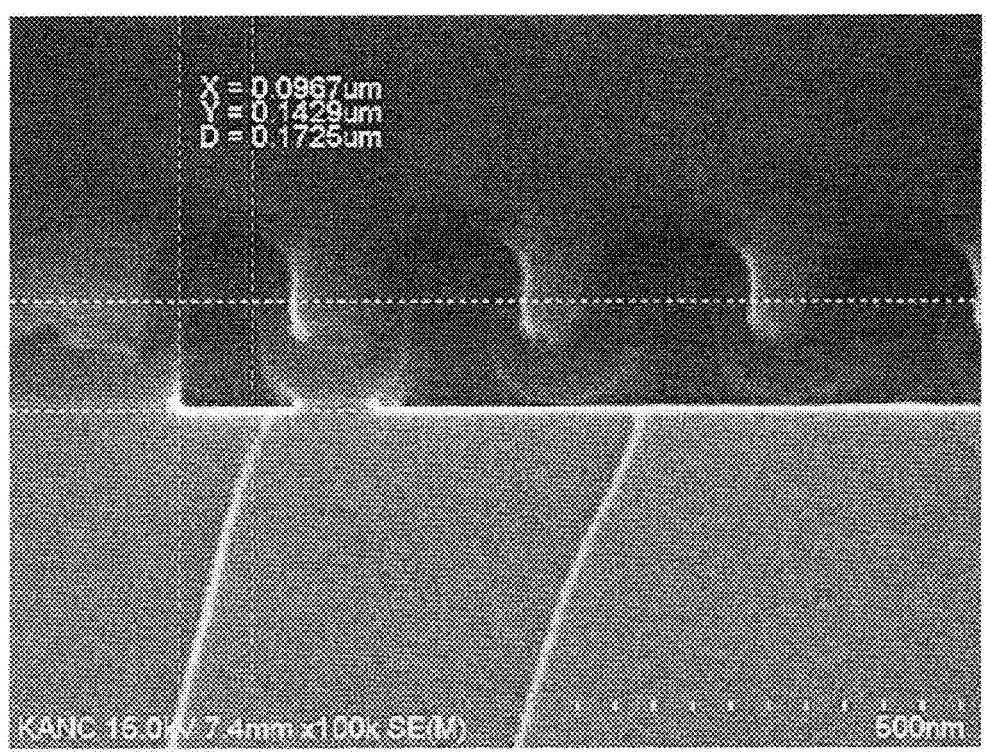

In another aspect, the present invention provides site-selectively grown horizontal nanowires prepared by the growth methods. FIGS. 30 and 31 show two steps of the method for the site-selective growth of horizontal nanowires taking advantage of the ability of the aluminum layer to be anodized. Specifically, FIG. 30 is a scanning electron microscopy (SEM) image showing the step of forming a plurality of long aluminum layers having a predetermined thickness, length and width at sites where it is desired to grow nanowires by patterning, and FIG. 31 is a SEM image showing the step of forming hollow channels surrounded by aluminum oxide films by anodization.

In yet another aspect, the present invention is directed to a nanodevice comprising the nanowires. Examples of the nanodevices include, but are not necessarily limited to, transistors, light-emitting devices, light-receiving devices, sensors, photodetectors, light-emitting diodes, laser diodes, electroluminescent (EL) devices, photoluminescent (PL) devices and cathodoluminescent (CL) devices.

Figure 20:
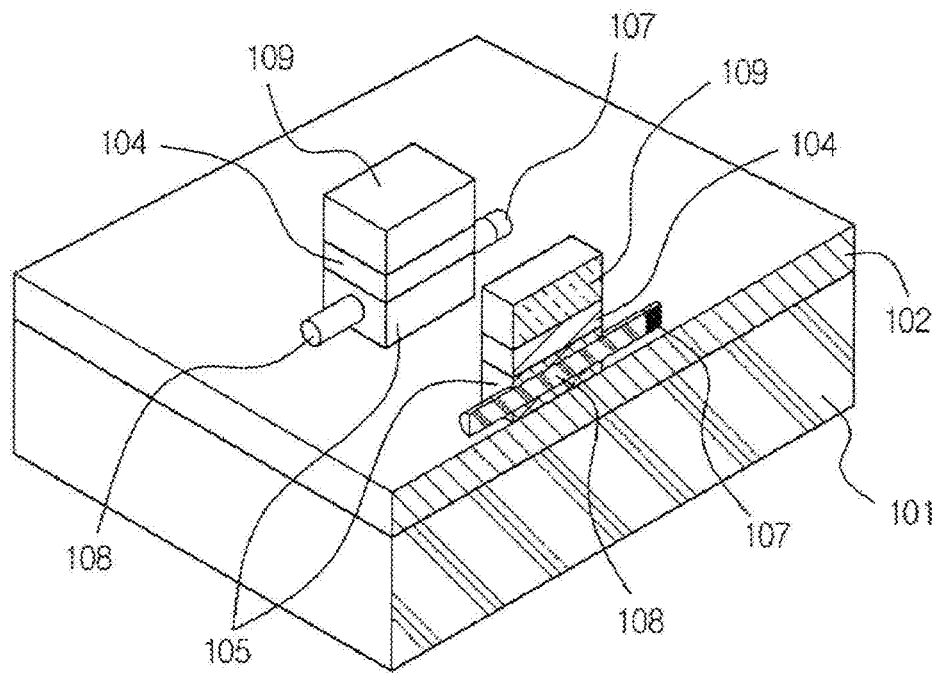
FIGS. 20 to 22 are cross-sectional perspective views that illustrate a method for fabricating a transistor comprising site-selectively grown horizontal nanowires according to an embodiment of the present invention.
Figure 21:
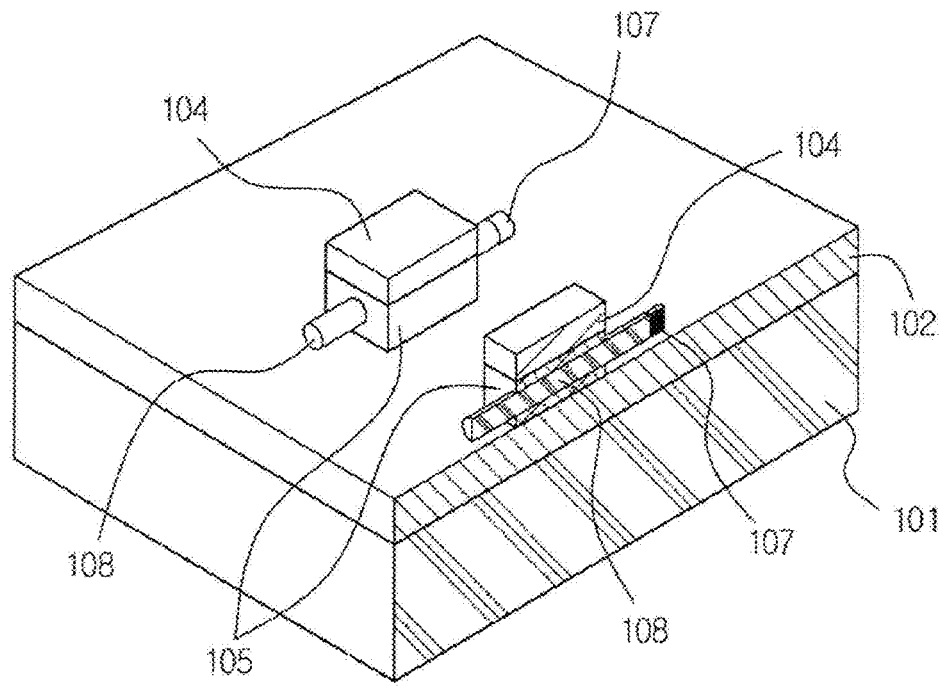
Figure 22:
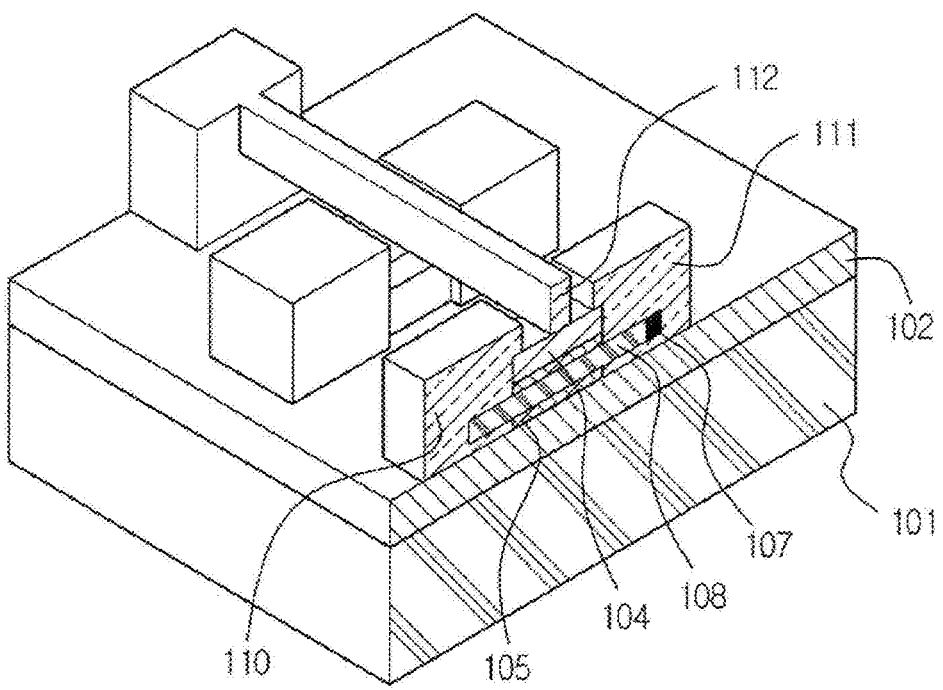

A representative example of the nanodevice is a transistor. FIGS. 20 to 22 illustrate a method for fabricating a transistor comprising a substrate, a gate electrode, a source electrode, a drain electrode and a channel layer wherein the channel layer is formed of the horizontal nanowires site-selectively grown by one of the methods of the present invention.

That is, the site-selectively grown horizontal nanowires are grown by the following procedure. First, a first silicon oxide thin film is formed on a silicon substrate. Portions of the first silicon oxide thin film and portions of the silicon substrate are sequentially removed by etching to form two or more elongated grooves having a predetermined width and length. The unetched portion of the first silicon oxide thin film remaining on the silicon substrate is removed. Subsequently, the surface of the silicon substrate having the elongated grooves is oxidized to form a second silicon oxide thin film. At this time, the three wall surfaces between the respective grooves are oxidized to leave silicon cores surrounded by the second silicon oxide thin film. Thereafter, portions of both ends of the silicon cores surrounded by the second silicon oxide thin film are vertically etched and removed by patterning. The silicon cores within the second silicon oxide thin film are dissolved to form hollow channels whose both ends are opened. Then, catalytic metal layers are deposited to cover the open ends positioned at one side of the hollow channels, and a protective film is formed on the upper surfaces of the catalytic metal layers to inhibit vertical growth of nanowires from the catalytic metal layers. Finally, nanowires are allowed to grow from the catalytic metal layers within the hollow channels in a direction parallel to the silicon substrate. The horizontal nanowires site-selectively grown by the method can be used to form the channel layer of the transistor.

Each of the catalytic metal layers can be used as the source or drain electrode of the transistor. The transistor may have gate interconnections connecting a plurality of other transistors, thus facilitating the fabrication of the transistors.

Alternatively, a method for fabricating a transistor is provided wherein the transistor comprises a substrate, a gate electrode, a source electrode, a drain electrode and a channel layer formed of the horizontal nanowires site-selectively grown by another method of the present invention.

That is, the site-selectively grown horizontal nanowires are grown by the following procedure. First, a first silicon oxide thin film is formed on a silicon substrate. At least one long aluminum layer having a predetermined thickness, length and width is formed at sites where it is desired to grow nanowires on the first silicon oxide thin film by patterning. Subsequently, a second silicon oxide thin film is formed to cover all surfaces except surfaces of one side of the aluminum layer. The uncovered surfaces of the aluminum layer is anodized to a predetermined depth to form hollow channels, each of which is surrounded by an aluminum oxide film, in a direction parallel to the silicon substrate. Thereafter, catalytic metal layers are deposited on the bottom surfaces of the hollow channels opposed to the openings of the hollow channels. Finally, nanowires are allowed to grow from the catalytic metal layers within the hollow channels in a direction parallel to the silicon substrate. The horizontal nanowires site-selectively grown by the method can be used to form the channel layer of the transistor.

The transistor may have gate interconnections connecting a plurality of other transistors, thus facilitating the fabrication of the transistors.

A more detailed explanation of the method will be provided below with reference to FIGS. 20 to 22. First, a mask layer 109 is formed on the surface of the second silicon oxide thin film 104 (FIG. 20). The mask layer 109 is formed by coating a photoresist to a desired thickness on the surface of the second silicon oxide thin film 104 and hard-baking the photoresist. This hard baking makes the mask harder.

After patterning by lithography, the mask layer 109 is removed. At this time, the unnecessary aluminum layer 103 is removed (FIG. 21). Subsequently, a source electrode 110, a drain electrode 111 and a gate electrode 112 are connected to the second silicon oxide thin film 104 to fabricate the final transistor.

At this time, the thickness of the second silicon oxide thin film 3 or the aluminum oxide film 105 cylindrically surrounding the nanowires and the entire length of the final device can be controlled by varying the growth speed of the nanowires within a deposition system. After growth of the nanowires, the remaining catalytic metal layers 7 or 107 can be used for contact with the drain electrode 111. Deposition can be performed to increase the size of the catalytic metal layers 7 or 107. In this case, each of the catalytic metal layers can be directly used as the drain electrodes 111.

When the horizontal nanowires prepared by the growth methods may be composed of a semiconductor or a metal oxide or have a p-n junction structure, they exhibit excellent light-emitting or light-receiving properties. Therefore, the horizontal nanowires prepared by the growth methods can be used to form light-emitting and light-receiving layers of light-emitting and light-receiving devices.

As apparent from the foregoing, the present invention provides methods for the site-selective growth of horizontal nanowires. According to the methods of the present invention, patterning or anodization can be performed to control the diameter of hollow channels through which nanowires are grown, thereby determining the diameter and length of the nanowires. In addition, according to the methods of the present invention, nanowires can be selectively grown at desired sites to facilitate the fabrication of a nanodevice with high degree of integration. The present invention also provides horizontal nanowires site-selectively grown by the methods. The horizontal nanowires of the present invention can be selectively grown at desired sites even in field effect transistors, light-emitting devices and light-receiving devices. Therefore, the horizontal nanowires of the present invention can be used for the integration of photonic devices and for the development of devices with a design rule of 10-30 nm.

What is claimed is:

1. A method for the site-selective growth of horizontal nanowires, the method comprising the steps of:
    forming a first silicon oxide film on a silicon substrate (first step);
    forming at least one pi-shaped aluminum layer having a thickness, a length and a width at sites where it is desired to grow nanowires on the first silicon oxide film by patterning (second step);
    forming a second silicon oxide thin-film to cover all surfaces except surfaces of one side of the pi-shaped aluminum layer (third step);
    anodizing the uncovered surfaces of the pi-shaped aluminum layer to a depth to form hollow channels, each of which is surrounded by an aluminum oxide film, in a direction parallel to the silicon substrate (fourth step);
    depositing catalytic metal layers on bottom surfaces of the hollow channels opposed to openings of the hollow channels (fifth step); and
    growing nanowires from the catalytic metal layers within the hollow channels in the direction parallel to the silicon substrate (sixth step).

2. The method according to claim 1, wherein, in the first step, the first silicon oxide film is formed by oxidizing a surface of the silicon substrate or deposited on the silicon substrate by a deposition technique selected from the group consisting of sputtering, chemical vapor deposition and thermal evaporation.

3. The method according to claim 1, wherein, in the second step, a plurality of pi-shaped aluminum layers are formed by patterning.

4. The method according to claim 1, wherein, in the second step, the pi-shaped aluminum layer is deposited by a technique selected from the group consisting of evaporation deposition, sputtering, e-beam evaporation and chemical vapor deposition.

5. The method according to claim 1, wherein the pi-shaped aluminum layer formed in the second step has a thickness of about 0.2 to about 2 μm.

6. The method according to claim 1, wherein each of the hollow channels formed in the fourth step has a length of about 0.1 to about 10 μm and a diameter of about 100 nm or less.

7. The method according to claim 1, wherein, in the sixth step, the nanowires are grown by a vapor-liquid-solid (VLS) growth technique using a metal constituting the catalytic metal layers as a catalyst.

* * * * *